US009226345B2

(12) United States Patent
Zbat et al.

(10) Patent No.: US 9,226,345 B2

(45) Date of Patent: Dec. 29, 2015

(54) WAVE CHOKE SYSTEM FOR AN OVEN DOOR OF A MICROWAVE OVEN

(75) Inventors: Abdel-Ilah Zbat, Wurzburg (DE); Arnd Hofmann, Schallfeld (DE)

(73) Assignee: ELECTROLUX HOME PRODUCTS CORPORATION N.V., Brussels (BE)

( * ) Notice: Subject to any disclaimer, the term of this patent is extended or adjusted under 35 U.S.C. 154(b) by 643 days.

(21) Appl. No.: 13/318,922

(22) PCT Filed: Jun. 16, 2010

(86) PCT No.: PCT/EP2010/003629

§ 371 (c)(1), (2), (4) Date: Nov. 4, 2011

(87) PCT Pub. No.: WO2011/000477

PCT Pub. Date: Jan. 6, 2011

(65) Prior Publication Data

US 2012/0085755 A1 Apr. 12, 2012

(30) Foreign Application Priority Data

Jul. 2, 2009 (EP) .................................... 09008661

(51) Int. Cl.

*H05B 6/76* (2006.01)

*H05K 9/00* (2006.01)

(52) U.S. Cl.

CPC .................................... *H05B 6/763* (2013.01)

(58) Field of Classification Search

CPC ................................ H05B 6/763; H05B 6/766

USPC ............ 219/736–743, 757; 174/35 R, 35 GC, 174/369, 382, 383

See application file for complete search history.

(56) References Cited

U.S. PATENT DOCUMENTS

| | | | | |
|---|---|---|---|---|
| 4,584,447 | A * | 4/1986 | Kusunoki et al. | 219/742 |
| 4,822,968 | A | 4/1989 | Chin | |
| 6,927,374 | B2 * | 8/2005 | Hu et al. | 219/742 |
| 2007/0012690 | A1 * | 1/2007 | Sim et al. | 219/741 |

FOREIGN PATENT DOCUMENTS

| | | |
|---|---|---|
| EP | 0116648 | 8/1984 |
| EP | 1426692 | 6/2004 |
| GB | 1345576 | 1/1974 |
| GB | 2143109 | 1/1985 |

OTHER PUBLICATIONS

International Search Report for PCT/EP2010/003629, dated Oct. 29, 2010, 3 pages.

* cited by examiner

*Primary Examiner* — Quang Van

(74) *Attorney, Agent, or Firm* — Pearne & Gordon LLP

(57) ABSTRACT

A wave choke system for an oven door of a microwave oven has an elongated channel for an outer portion of the oven door and an elongated cover sheet covering partially the width of an open longitudinal side of the channel. The cover sheet includes a plurality of slots extending perpendicular to the longitudinal axis of the cover sheet. Each slot includes an open end at a longitudinal edge of the cover sheet and a closed end on the opposite side of the open end, a broadening in a central portion of the slot, a first small portion between the open end and the broadening and a second small portion between the broadening and the closed end. The slots are reciprocally intersected, so that the contours of the slots and the intermediate pieces between the slots are formed complementarily to each other.

12 Claims, 2 Drawing Sheets

WAVE CHOKE SYSTEM FOR AN OVEN DOOR OF A MICROWAVE OVEN

Figure 1:
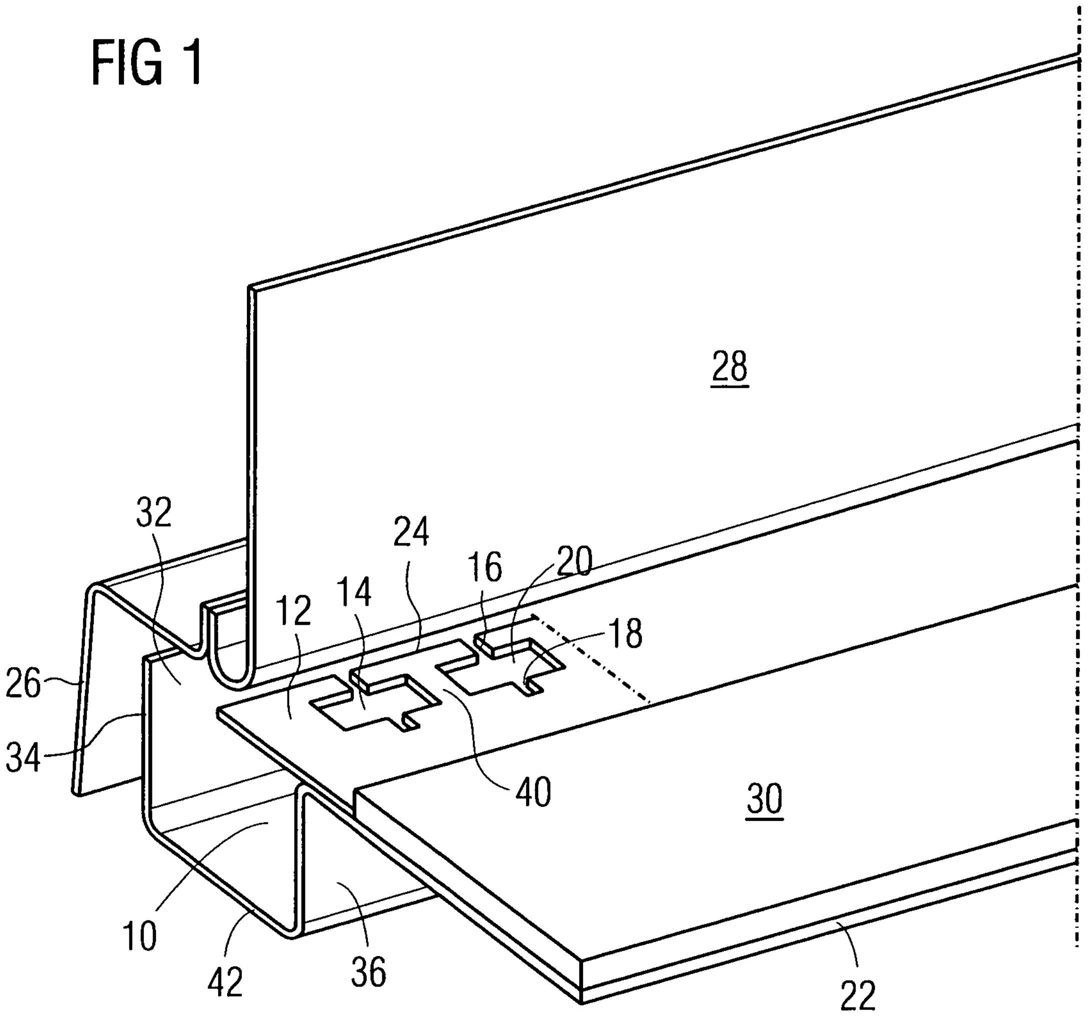

The present invention relates to a wave choke system for an oven door of a microwave oven. Further, the present invention relates to an oven door for a microwave oven. Additionally, the present invention relates to a microwave oven.

Microwave ovens are often used in households in order to heat food stuff and beverages. However, microwave ovens generate strong electromagnetic fields. Said electromagnetic fields are a potential threat to the health of the user, if the electromagnetic fields or parts of them leave the cavity of the microwave oven. The door of the microwave oven is the most critical part. In particular, microwaves may leave the cavity through the gap between the door frame and the front frame of the cavity.

Usually, the gap between the oven door and the cavity is sealed with respect to microwaves by integrating wave chokes into the door frame and/or onto the cavity frame. Such wave choke systems base on a $\lambda/4$ transformation. However, mechanical tolerances of the cavity frame and the frame of the oven door can evoke local areas of an increased leakage. Further, a plurality of slots is used for the fine tuning of the wave choke.

It is an object of the present invention to provide an improved wave choke system for an oven door of a microwave oven, wherein said wave choke system can be produced in a relative simple way.

This object is achieved by the wave choke system according to claim 1.

The wave choke system according to the present invention is provided for an oven door of a microwave oven and comprises an elongated channel for an outer portion of the oven door and an elongated cover sheet covering partially the width of an open longitudinal side of said channel, wherein

- the cover sheet includes a plurality of slots extending perpendicular to the longitudinal axis of the cover sheet,
- the slot includes an open end at a longitudinal edge of the cover sheet and a closed end on the opposite side of said open end,
- the slot includes a broadening in a central portion of the slot,
- the slot includes a first small portion between the open end and the broadening, and
- the slot includes a second small portion between the broadening and the closed end, and
- the slots are reciprocally intersected, so that the contours of the slots and intermediate pieces between the slots are formed complementary to each other.

The main idea of the present invention is the reciprocal intersected slots and the complementarily formed contours of the slots and intermediate pieces. The geometric form of the slots allows a reduced leakage and a higher bandwidth. The structure of the inventive wave choke system allows a more robust functionality against mechanical tolerances of the cavity side wall and the cavity front frame. This structure allows robustness against the negative influence while the oven door opens.

According to a preferred embodiment of the present invention the width of the broadening corresponds with the width of the intermediate piece between the small portions of two neighbouring slots.

In a similar way, the width of the small portions of the slot may correspond with the width of the intermediate piece between two neighbouring broadenings.

Preferably, the wave choke system is provided for a door frame of the oven door, wherein the cover sheet and the open longitudinal side of said channel face a cavity front frame and or a front portion of a cavity side wall. The cavity front frame and the front portion of the cavity side wall are very critical part, where the electromagnetic fields can leave the cavity of the microwave oven.

For example, the wave choke system may enclose circumferentially the oven door within the door frame at least partially.

In particular, the broadenings in the central portion of the slots may have a rectangular form. For example, the slots form a cross-shaped recess.

Preferably, the slots may extend within one plane. This contributes to a simple production.

Additionally, also the cover sheet may extend within one plane of the cover sheet. This is a further contribution for a simple production.

Further, the channel may be filled with at least one dielectric medium. Alternatively or additionally the open longitudinal side of said channel may be covered by a cover element, for example formed as an L-shaped profile rail. The dielectric medium as well as the cover element is suitable to prevent the infiltration of the non-desirable particles and substances into the channel.

According to the preferred embodiment of the present invention the width of the channel is a quarter of the wavelength of the microwaves. In this case the wave choke system and the channel act as a wave trap.

Additionally or alternatively, the slots and the intermediate pieces may be formed as LC resonant circuits. In this case it would not be necessary that the width of the channel is a quarter of the wavelength.

Further, the present invention relates to an oven door comprising at least one wave choke system as described above.

At last, the present invention relates to a microwave oven with at least one oven door and at least one wave choke system as described above.

The novel and inventive features believed to be the characteristic of the present invention are set forth in the appended claims.

Figure 2:
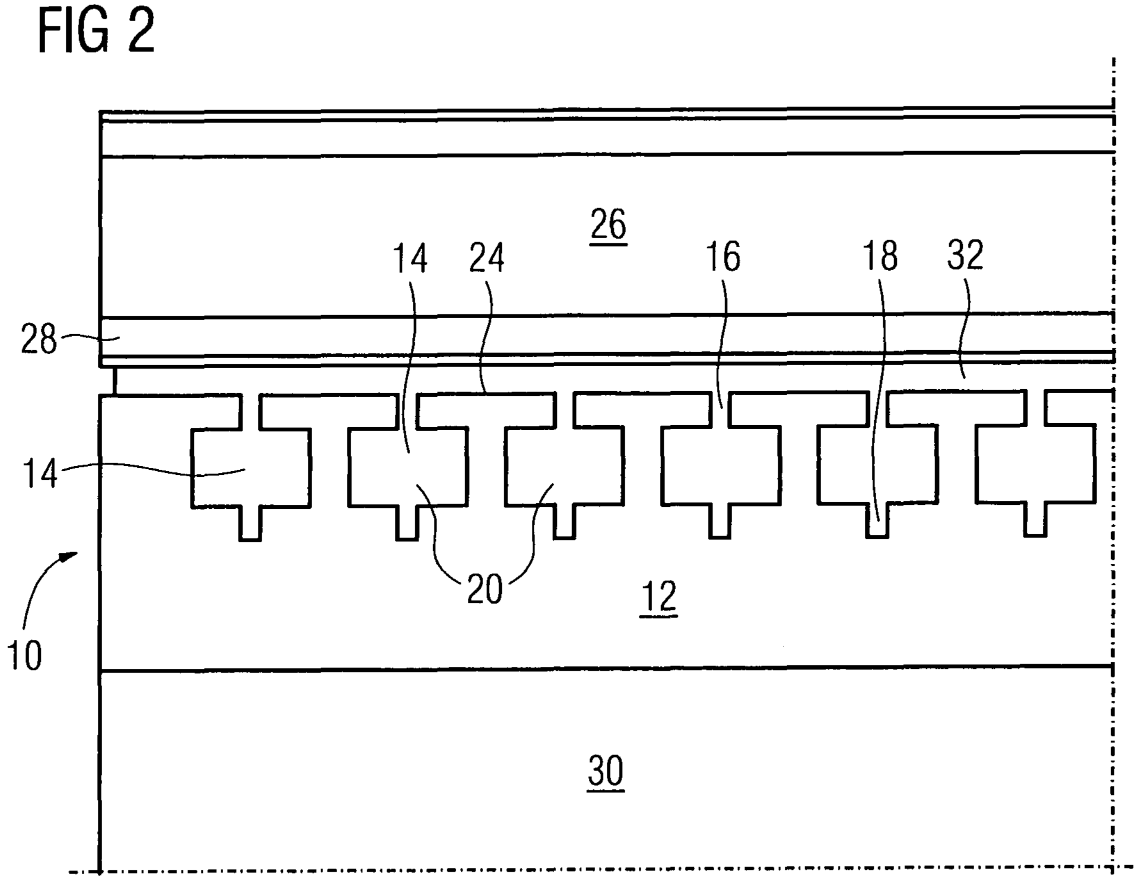
Figure 3:
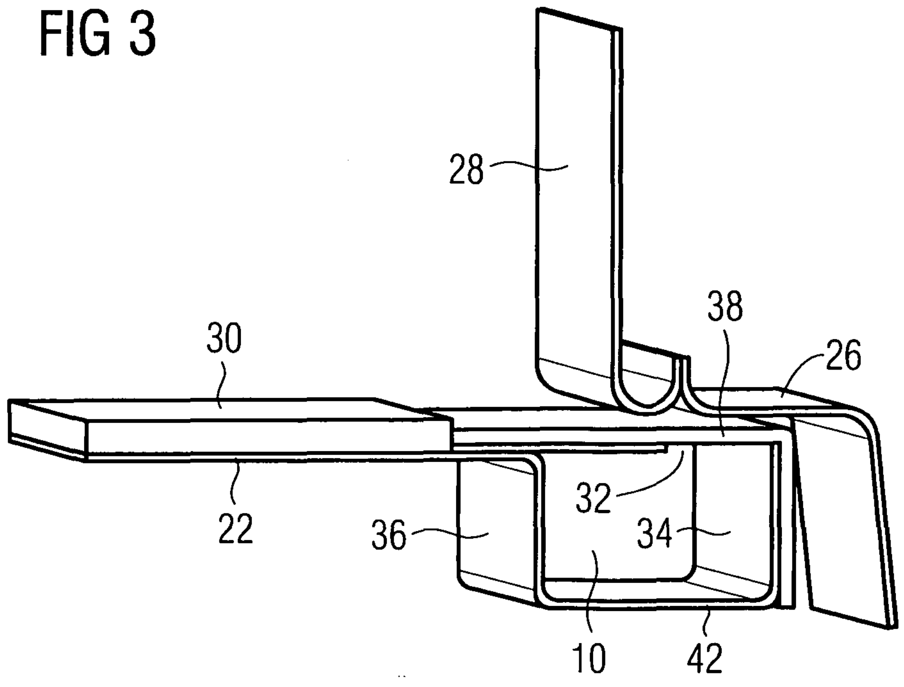

The invention will be described in further detail with reference to the drawing, in which FIG. 1 illustrates a perspective sectional view of a wave choke system for a door of a microwave oven according to a preferred embodiment of the present invention, FIG. 2 illustrates a top view of the wave choke system according the preferred embodiment of the present invention, and FIG. 3 illustrates a perspective sectional view of a section of the wave choke system according to a further embodiment of the present invention.

FIG. 1 illustrates a perspective sectional view of a wave choke system for a door of a microwave oven according to a preferred embodiment of the present invention.

The wave choke system comprises a channel 10 with a substantially rectangular cross section. The channel 10 is the appendix of a door panel 22. The channel 10 forms the border of said door panel 22. The channel 10 encloses partially or completely the door panel 22. In this example the door panel 22 and the channel 10 form a single-piece part. The door panel 22 with the channel 10 have been made by bending a sheet.

An inner channel wall 36 extends from the door panel 22 perpendicularly to the plane said door panel 22. A central channel wall 42 extends from the inner channel wall 36 perpendicularly to the inner channel wall 36 and parallel to the plane of the door panel 22. An outer channel wall 34 extends from the central channel wall 42 perpendicularly to said central channel wall 42 and parallel to the inner channel wall 36.

The cross-section of the channel 10 has three closed sides 36, 38 and 42 and one open side. The open side of the channel 10 is partially covered by an elongated cover sheet 12. The cover sheet 12 extends parallel to the channel 10. The cover sheet 12 covers partially the width of the open side of the channel 10. In this example about the half width of the open side is covered by the cover sheet 12. Thus, a gap 32 between the cover sheet 12 and the outer channel wall 34 is formed. The gap 32 is permeable for the microwaves.

The channel 10 and the cover sheet 12 are made of an electrically conductive material, in particular metal.

The cover sheet 12 includes a plurality of slots 14 extending perpendicular to the longitudinal axis of the cover sheet 12. Although in FIG. 1 only two slots 14 are shown, the slots 14 are distributed over the whole cover sheet 12. The slots 14 are equally spaced apart from each other. Each slot 12 has an open end at a longitudinal edge 24 of the cover sheet 12 and a closed end opposite to said open end. The slot 14 includes a broadening 20 in its central portion. In this example the broadening 20 has a rectangular form.

Each slot 12 has an outer small portion 16 between the longitudinal edge 24 of the cover sheet 12 and the broadening 20. In similar way, each slot 12 has an inner small portion 18 between the broadening 20 and the closed end of the slot 14. In this example, the contours of the slots 14 include only right angles and the slots 14 have the form of a cross.

The channel 10 is arranged within a door frame of an oven door for a microwave oven. In a closed state of the oven door the channel 10 is arranged besides a cavity front frame 26 and in front of a cavity side wall 28.

On the door panel 22 a viewing glass 30 is attached. In its central portion the door panel 22 comprises a cutout or a plurality of holes. Thus, the viewing glass 30 allows a view inside the cavity of the oven. Preferably, the viewing glass 30 is made of plastics or glass.

In this embodiment, the channel 10 has a width corresponding with is a quarter of the wavelength of the microwaves. The wavelength of the microwaves is about 122 mm in the free space. The channel 10 with a width of a quarter of the wavelength acts as a wave trap. If the channel 10 is filled with a dielectric material, then the width of the channel 10 has to be adapted to the quarter of the wavelength of the microwaves in said dielectric material.

In an alternative embodiment of the present invention the channel 10 with the slots 14 and intermediate pieces 40 between the slots 14 may act as LC resonant circuits. In this case one intermediate piece 40 acts as an inductance and two neighboured intermediate pieces 40 act as a capacitor. The inductance and the capacitor form the LC resonant circuit. The geometric sizes of the slots 14 and the intermediate pieces 40 have to be adapted to the frequency of the microwaves. In this case it is not necessary that the channel 10 has a width of a quarter of the wavelength of the microwaves.

FIG. 2 shows a top view of the wave choke system according the preferred embodiment of the present invention. In particular, FIG. 2 illustrates the contours and the arrangement of the slots 14 and the intermediate pieces 40 between the slots 14.

The slots 14 with the broadenings 20 are reciprocally intersected. The contours of the slots 14 and the intermediate pieces 40 are formed complementarily to each other.

The widths of the broadenings 20 correspond substantially with the widths of the intermediate pieces 40 between the small portions 16 and 18 of two neighbouring slots 14. In a similar way, the widths of the small portions 16 and 18 of the slots 14 correspond substantially with the widths of the intermediate piece between the broadenings 20 of two neighbouring slots 14. In this example the widths of the outer small portion 16 and the inner small portion 18 are equal.

FIG. 3 illustrates a perspective sectional view of a section of the wave choke system according to a further embodiment of the present invention. Said further embodiment of FIG. 3 is similar to the embodiment of FIG. 1.

Additionally, the wave choke system of FIG. 3 comprises a cover element 38. The cover element 38 is arranged on the open side of the channel 10. The cover sheet 12 and the outer channel wall 34 are covered by the cover element 38. Thus, also the gap 32 between the cover sheet 12 and the outer channel wall 34 is covered by the cover element 30.

The cover element 38 is made of an electrically non-conductive material. The cover element 38 is formed as an L-shaped profile section. The cover element 38 is provided to prevent the infiltration of the non-desirable particles and substances into the channel 10.

Although illustrative embodiments of the present invention have been described herein with reference to the accompanying drawing, it is to be understood that the present invention is not limited to those precise embodiments and that various other changes and modifications may be affected therein by one skilled in the art without departing from the scope or spirit of the invention. All such changes and modifications are intended to be included within the scope of the invention as defined by the appended claims.

List Of Reference Numerals

10 channel
12 cover sheet
14 slot
16 outer small portion, first small portion
18 inner small portion, second small portion
20 broadening
22 door panel
24 longitudinal edge of the cover sheet
26 cavity front frame
28 cavity side wall
30 viewing glass
32 gap
34 outer channel wall
36 inner channel wall
38 cover element
40 intermediate space
42 central channel wall

The invention claimed is:

1. A wave choke system for an oven door of a microwave oven, comprising an elongated channel (10) provided for an outer portion of the oven door and an elongated cover sheet (12) covering partially the width of an open longitudinal side of said channel (10), wherein the cover sheet (12) includes a plurality of slots (14) extending perpendicular to the longitudinal axis of the cover sheet (12), each of the slots (14) includes an open end at a longitudinal edge of the cover sheet (12) and a closed end on the opposite side of said open end, each of the slots (14) includes a broadening (20) in a central portion of each of the slots (14), each of the slots (14) includes a first small portion (16) between the open end and the broadening (20), each of the slots (14) includes a second small portion (18) between the broadening (20) and the closed end, and the slots (14) are reciprocally intersected, so that the contours of the slots (14) and intermediate pieces (40) between the slots (14) are formed complementary to each other, wherein the first small portion (16) and the second small portion (18) of each of the slots (14) are collinear, wherein the width of the broadening (20) corresponds with the width of the intermediate piece (40) between the first small portions (16) and the second small portions (18) of two neighbouring slots (14).

2. The wave choke system according to claim 1, characterized in that the width of the first small portion (16) and the width of the second small portion (18) of the slots (14) corresponds with the width of the intermediate piece (40) between two neighbouring broadenings (20).

3. The wave choke system according to claim 1, characterized in that the wave choke system is provided for a door frame of the oven door, wherein the cover sheet (12) and the open longitudinal side of said channel (10) face a cavity front frame (26) and or a cavity side wall (28).

4. The wave choke system according to claim 1, characterized in that the wave choke system encloses circumferentially the oven door within the door frame at least partially.

5. The wave choke system according to claim 1, characterized in that the broadening (20) in the central portion of the slots (14) has a rectangular form.

6. The wave choke system according to claim 1, characterized in that the slots (14) form a cross-shaped recess.

7. The wave choke system according to claim 1, characterized in that the cover sheet (12) substantially extends within one plane.

8. The wave choke system according to claim 1, characterized in that the slots (14) substantially extend within one plane of the cover sheet (12).

9. The wave choke system according to claim 1, characterized in that the channel (10) is filled with at least one dielectric medium.

10. The wave choke system according to claim 1, characterized in that the open longitudinal side of said channel (10) is covered by a cover element (38).

11. The wave choke system according to claim 1, characterized in that the width of the channel (10) is a quarter of the wavelength of the microwaves.

12. The wave choke system according to claim 1, characterized in that the slots (14) and the intermediate pieces (40) are formed as LC resonant circuits.

* * * * *